United States Patent [19]

Guterman

[11] 4,422,092
[45] Dec. 20, 1983

[54] HIGH COUPLING RATIO ELECTRICALLY PROGRAMMABLE ROM

[75] Inventor: Daniel C. Guterman, Houston, Tex.

[73] Assignee: Texas Instruments Incorporated, Dallas, Tex.

[21] Appl. No.: 344,289

[22] Filed: Feb. 1, 1982

Related U.S. Application Data

[62] Division of Ser. No. 75,854, Sep. 17, 1979, Pat. No. 4,326,331.

[51] Int. Cl.³ .......................................... H01L 27/02
[52] U.S. Cl. .................................... 357/41; 357/59; 357/23
[58] Field of Search ................... 357/23 VT, 41, 59

[56] References Cited

U.S. PATENT DOCUMENTS 4,258,378  3/1981  Wall ............................. 357/23 VT
4,282,540  8/1981  Ning et al. .................... 357/23 VT Primary Examiner—Martin H. Edlow
Attorney, Agent, or Firm—John G. Graham

[57] ABSTRACT

An electrically programmable read only memory (EPROM) of the floating gate type is constructed having an improved coupling ratio made by allowing the edges of the floating gates to be self aligned with the edges of the control gates. The ratio of the capacitance between the floating gate and control gate is increased by extending the floating gate out over the source and drain.

3 Claims, 16 Drawing Figures

HIGH COUPLING RATIO ELECTRICALLY PROGRAMMABLE ROM

This is a division of application Ser. No. 75,854, filed Sept. 17, 1979, now U.S. Pat. No. 4,326,311.

BACKGROUND OF THE INVENTION

This invention relates to semiconductor memory devices and methods of manufacture, and more particularly to an electrically programmable read only memory (EPROM) of the floating gate type.

Nonvolatile memory devices using a floating gate to retain charge are made by a double level polysilicon process as set forth in U.S. Pat. No. 4,122,544 issued to David J. McElroy and U.S. Pat. No. 4,112,509 issued to Lawrence S. Wall, both assigned to Texas Instruments, or in U.S. Pat. No. 3,984,822 issued to Simko et al. Other EPROM and electrically erasable EPROM cells and processes are shown in pending applications Ser. No. 957,518, filed Nov. 2, 1978, by Kuo and Tsaur and Ser. No. 1,097, filed Jan. 5, 1979, by Guterman and Chiu, both assigned to Texas Instruments. Some of these types of devices are widely used in microcomputers, particularly in program development.

The stacked gate structure of these prior EPROM cells include a first level polysilicon floating gate memory element and a second level poly control gate, producing a transistor which is inherently of lower gain than a comparable standard single-level silicon gate device due to three factors. First, the channel is doped P+ to enhance programming efficiency, at the expense of reduced K' in linear operation. Second, high channel doping results in earlier saturation as indicated by the larger alpha, usually about 2.0, whereas for lightly doped channels alpha is approximately unity; the drain voltage at saturation is approximately equal to gate voltage minus threshold voltage divided by alpha. Third, the channel is controlled directly by the floating gate, whose potential is governed in turn by the applied control gate voltage and the capacitance coupling ratio from floating to control gate vs. total capacitance seen by the floating gate given to first approximation by:

$$\text{Coupling Ratio} = \frac{Cf-c}{Cf-c + Cf-ch}$$

Where $Cf-c$ is the capacitance between the floating gate and the control gate and $Cf-ch$ is the capacitance between the floating gate and the channel. The floating gate in effect shields the channel from the control gate, since it is a conductor, so the only way the voltage on the control gate can influence the channel is by capacitive coupling to the floating gate. If the capacitances are equal in the above formula, the coupling ratio is 50%, so one-half the control gate voltage is coupled to the floating gate and a 5V logic level becomes a 2.5V level as seen by the channel. Typical coupling factors in EPROM devices now in volume production having 0.2 mil channel widths and 0.15 mil overlap on each side onto field oxide can exceed 65%. The coupling ratio is of course a function of the dielectric thickness of the two capacitors as formed by gate oxide and interlevel oxide. For those production devices, the ratio of dielectric thickness is about 1.3 interlevel to 1.0 gate because the oxide thicknesses are about 1000 and 800 Å, respectively. To increase the coupling ratio, significant portions of the floating gate must extend out over field oxide and be overlapped by the second level poly control gate, requiring excess spacing for alignment. Further, as the cell size is reduced for higher cell density, as for a 128K bit device, the channel widths become much narrower, helping the coupling ratio but causing low and poorly controlled channel width-to-length ratios.

It is, therefore the principal object of this invention to provide an improved electrically programmable memory, particularly with improved coupling ratio. Another object is to provide an EPROM of reduced cell size. An additional object is to provide a dense array of EPROM cells having improved characteristics, made by a more efficient method.

SUMMARY OF THE INVENTION

In accordance with an illustrative embodiment of the invention an electrically programmable memory array of the floating gate type with a high coupling ratio is made by a process which allows the edges of the floating gates to be self-aligned with the edges of the control gates. The source and drain regions are formed prior to applying the first level polysilicon by a process which leaves these regions covered with thick oxide, rather than using the polysilicon as a mask to define the gate areas. The ratio of the capacitance between the floating gate and control gate to the total capacitance at the floating gate is increased by extending the floating gate out over the source and drain since the thick oxide reduces coupling from the floating gate to the source and drain.

In this cell structure, the coupling ratio is optimized at a minimum cost in cell area.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF SPECIFIC EMBODIMENTS

Figure 1:
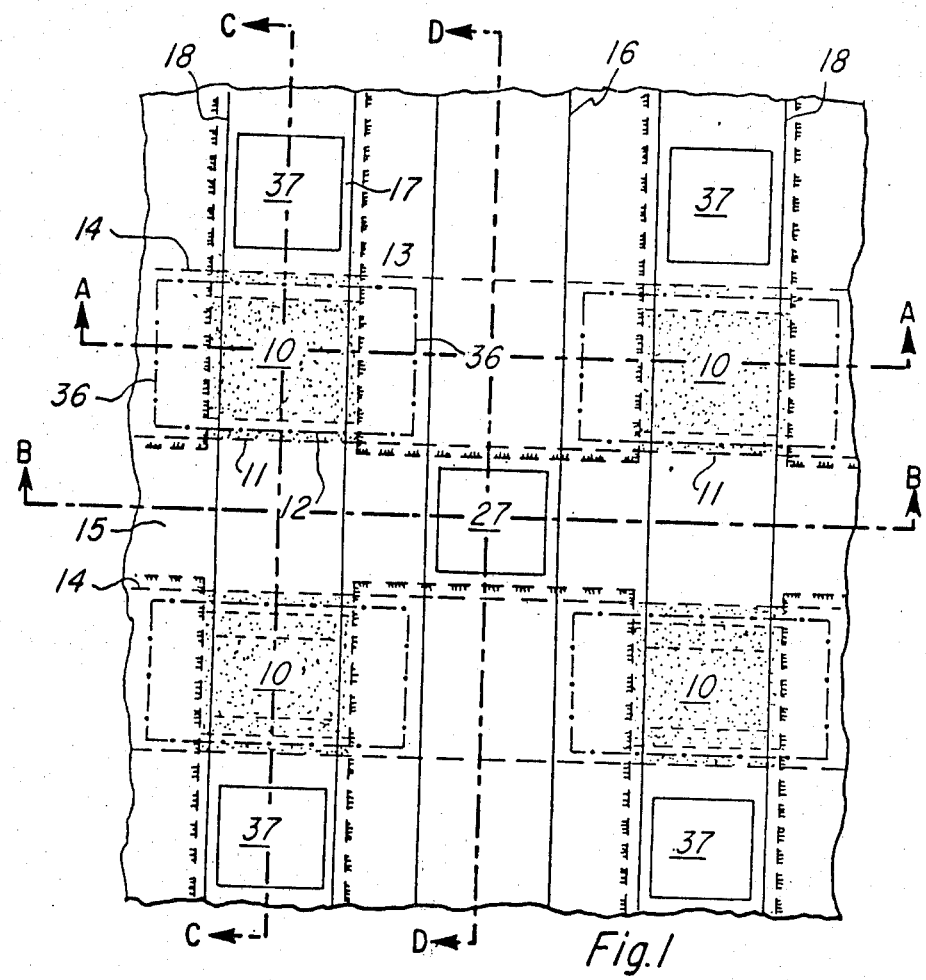
FIG. 1 is a greatly enlarged plan view of a small portion of a semiconductor chip showing the physical layout of a part of an EPROM array made according to the invention.
Figure 2:
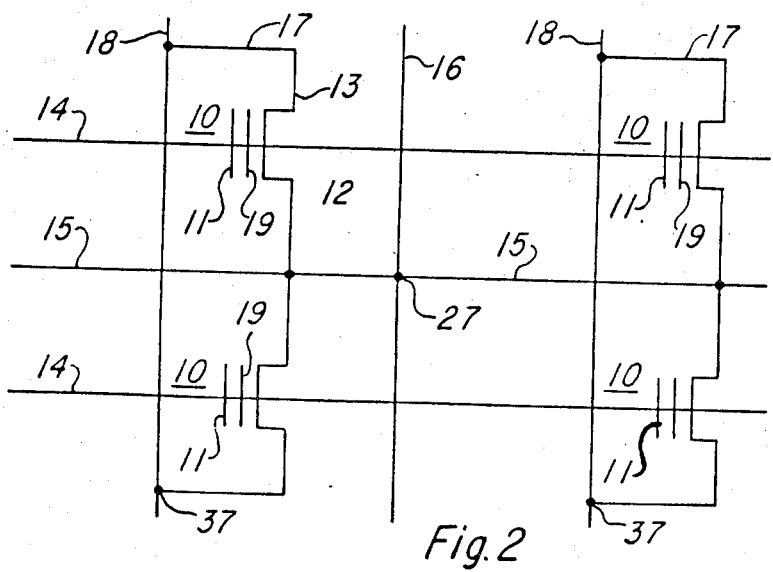
FIG. 2 is an electrical schematic diagram of the ROM of FIG. 1.
Figure 3A:
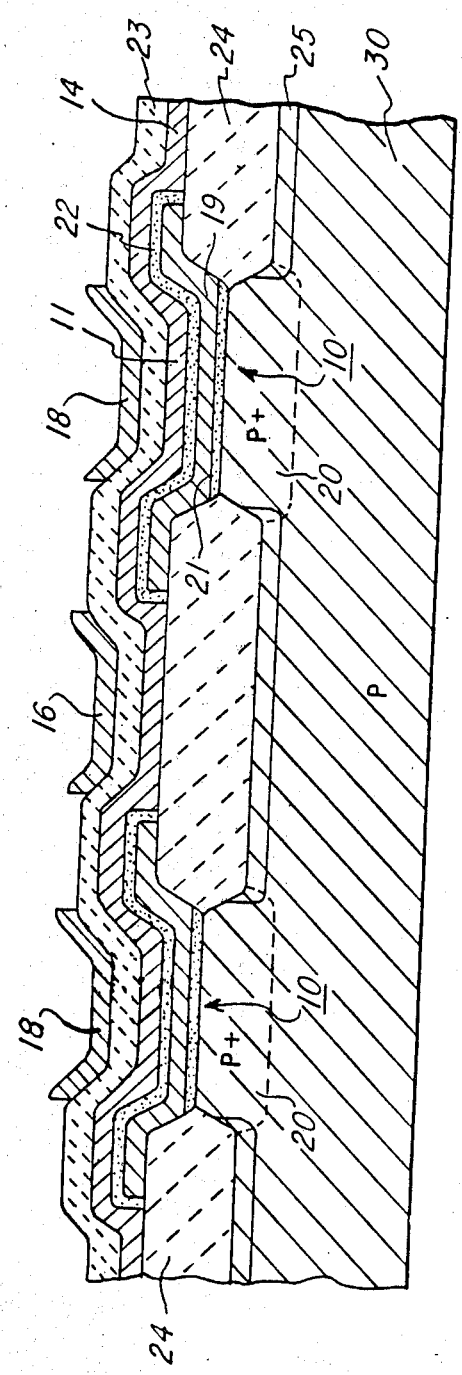
FIGS. 3a-3d are elevation views in section of the cell of FIG. 1, taken along the lines a—a, b—b, c—c, and d—d, respectively.
Figure 3B:
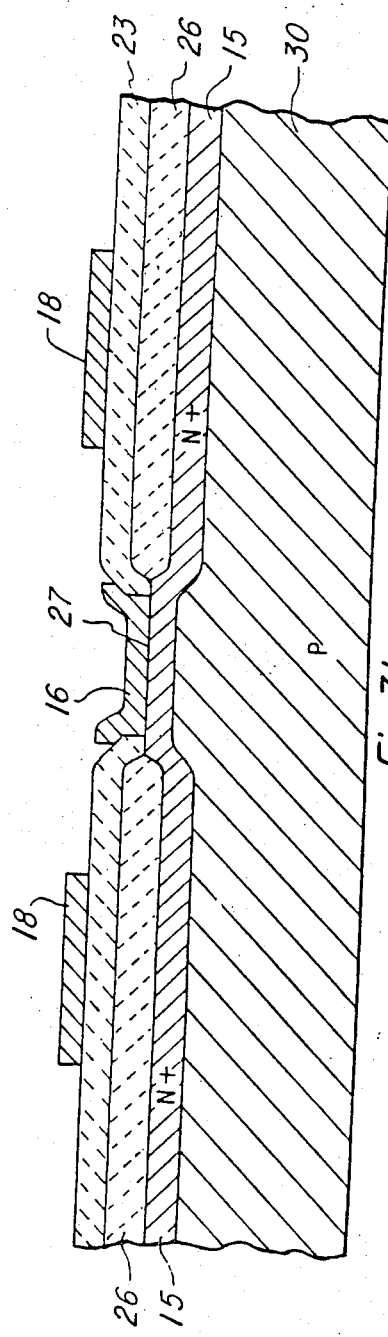
Figure 3C:
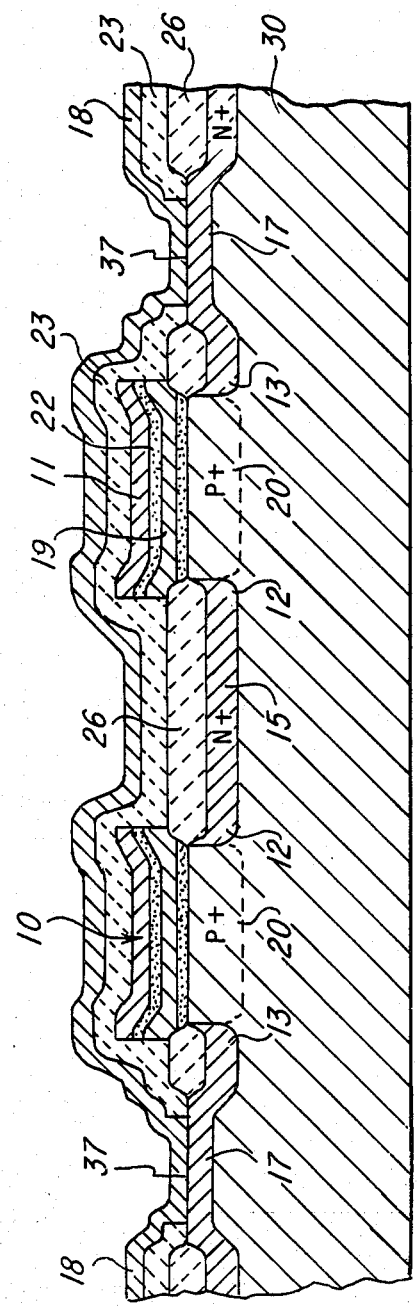
Figure 3D:
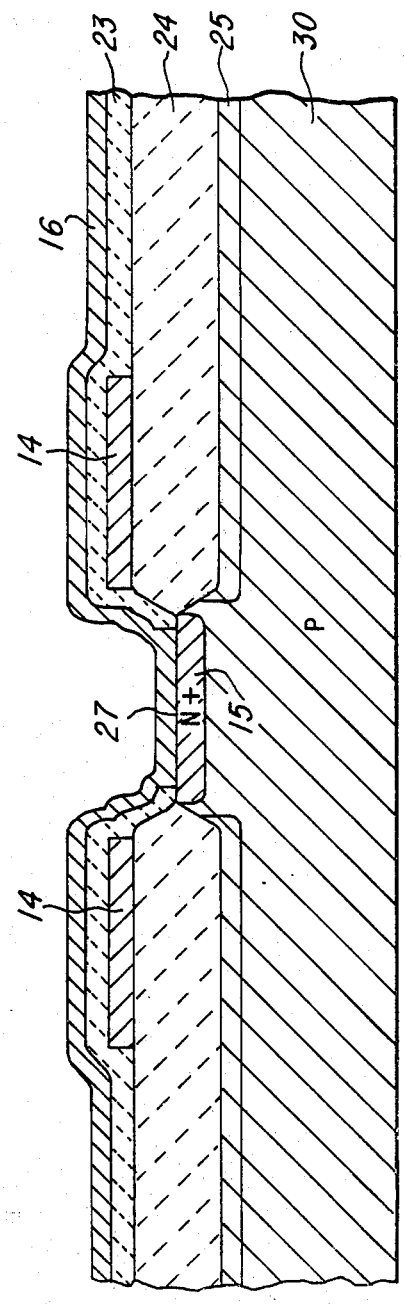
Figure 5A:
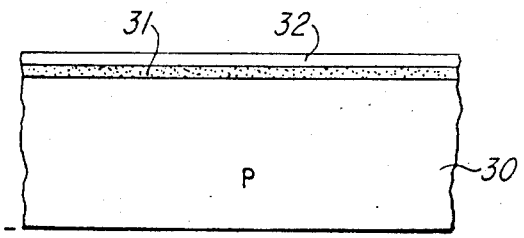

With reference to FIGS. 1, 2, and 3a-3d, an electrically programmable read only memory is illustrated which is made according to the invention. The array consists of a large number of cells 10, only four of which are shown. Each cell is an MOS transistor having a control gate 11, a source 12 and a drain 13. The gates 11 are parts parts of polysilicon strips 14 which are the X address lines for the array. The sources are part of an N+ diffused region 15 which is connected to a ground or Vss line 16, while the drains are part of N+ diffused regions 17 which are connected to Y output lines 18. A floating gate 19 is interposed between the control gate 11 and the channel in each cell 10. A P+ tank 20 is provided in each channel area for optimum programming characteristics.

The array typically contains perhaps 64 or 128K bits on a bar less than about 1/130 inch square, depending upon the bit density. The four cells 10 shown would be on a minute part of the bar, perhaps about one mil wide. A 64K EPROM would require 256 of the X address lines 14 and 256 of the Y lines 18, providing 65,536 bits.

A thin gate oxide layer 21 separates the floating gate 19 from the silicon surface, and another thin thermal oxide layer 22 separates the floating gate from the control gate 11 in each cell. A thick layer 23 of deposited oxide overlies the upper level of polysilicon. A thick field oxide coating 24 covers parts of the bar not occupied by the transistors or diffused interconnects (i.e., "moats"), and P+ channel stop regions 25 are formed underneath all the thick field oxide. A thinner field oxide coating 26 covers the N+ diffused regions 12, 13, 15 and 17.

In order to reduce the series resistance of the elongated conductive N+ regions 15, metal strips 16 may be connected to the regions periodically. For example, a metal-to-silicon contact 27 may be made once every eight or sixteen cells, depending upon the resistivity of the N+ regions. These metal strips are particularly important for programming where higher currents are used than for the read mode.

The cell array is programmed by injection of electrons into the floating gates 19 by application of high voltage to a selected one of the polycrystalline silicon strips 14 and one of the Y lines 18 to raise the threshold voltage of the selected one of the cells 10 to a value above that which will be turned on by a 5V. logic level voltage on an address line 14.

Injection occurs with drain 13 and gate 11 held at high voltage, typically +15 and +25V, respectively, and source 12 held at Vss, resulting in a large current flow in the channel, and causing electrons of high energy state to traverse the gate oxide layer 21 and charge the floating gate 19. After the programming voltage is removed, the floating gate remains charged. All other cells with low voltage on either gate or drain will not be affected; that is, cells with either the X line 14 or Y line 18 are low are not programmed. The array is erased by ultraviolet light, or perhaps electrically as set forth in U.S. Pat. No. 4,122,544.

Turning now to FIGS. 4a-4e, and 5a-5e, a process for making the EPROM array of the invention will be described. The starting material is a slice of P-type monocrystalline silicon, typically four inches in diameter and twenty mils thick, cut on the <100> plane, of a resistivity of about 12 to 15 ohm-cm. As mentioned above, in the FIGURES the portion shown of the bar 30 represents only a very small part of the slice, perhaps 1 or 2 mils wide. After appropriate cleaning, the slice is oxidized by exposing to oxygen in a furnace at an elevated temperature of perhaps 1100° C. to produce an oxide layer 31 over the entire slice of a thickness of about 1000 Å. Next, a layer 32 of silicon nitride of about 1000 Å thickness is formed over the entire slice by exposing to an atmosphere of dicholoro silane and ammonia in a reactor. A coating of photoresist is applied to the entire top surface of the slice, then exposed to ultraviolet light through a mask which defines the desired pattern of the thick field oxide 24 and the P+ channel stop 25 (to be later formed). The resist is developed, leaving areas where nitride is then etched away by a nitride etchant, removing the exposed part of the nitride layer 32 but leaving in place the oxide layer 31.

Using the photoresist and nitride as a mask, the slice is now subjected to an ion implant step 25, whereby boron atoms are introduced into unmasked regions 33 of silicon. The regions 33 do not exist in the same form in the finished device, because some of this part of the slice will have been consumed in the field oxidation procedure. Usually the slice would be subjected to a heat treatment after implant but prior to field oxide growth, as set forth in U.S. Pat. No. 4,055,444, issued to G. R. Mohan Rao, assigned to Texas Instruments.

Figure 4A:
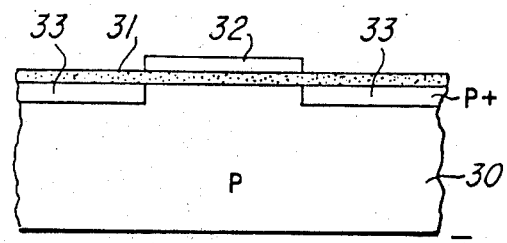
FIGS. 4a-4e and 5a-5e are elevation views in section of the EPROM array of FIGS. 1 and 3a-3d, at successive stages and line c—c, respectively in the manufacturing process, taken generally along the line a—a in FIG. 1.
Figure 4B:
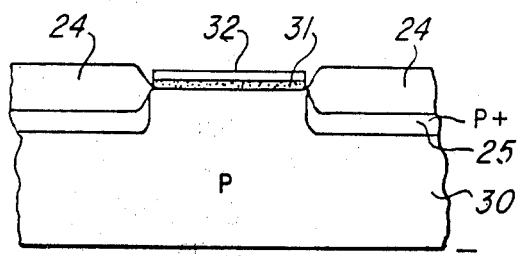

The next step in the process is the initial formation of field oxide 24, which is done by subjecting the slices to steam or an oxidizing atmosphere at about 900° to 1000° C. for several hours. This causes a thick field oxide region or layer 24 to be grown, as seen in FIG. 4b, extending into the silicon surface as silicon is consumed during oxidization. The parts of the nitride layer 32 remaining on the slice mask oxidation. The thickness of this layer 24 is about 700 Å, about half of which is above the original surface and half below. The boron doped P+ regions 33 formed by implant will be partly consumed, but will also diffuse further into the silicon ahead of the oxidation front producing P+ field stop regions 25 much deeper than the original regions 33. Additional thickness of the layer 24 results from subsequent heat treatments.

Figure 5B:
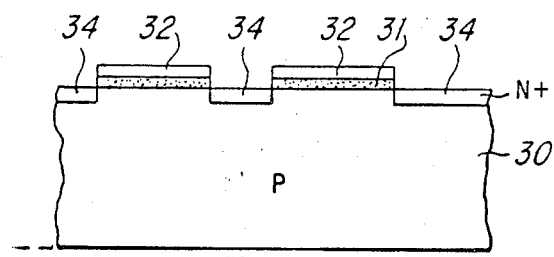

Referring to FIG. 5b, the slice is now subjected to another photoresist operation to define the source and drain areas 12 and 13 (to be later formed) as well as the regions 15 and 17 (also later formed) which are to be N+ diffused. A nitride etchant removes the parts of the nitride layer 32 now exposed by holes in the photoresist, then parts of the oxide layer 31 exposed when this nitride is removed are etched to expose bare silicon. A phosphorus diffusion produces the N+ regions 34 which will subsequently become the sources, drains, etc. (mentioned above). Instead of diffusion, these N+ regions 34 may be formed by an arsenic ion implant, in which case the oxide layer 31 would be left in place and an anneal step used before the subsequent oxidation.

Figure 4C:
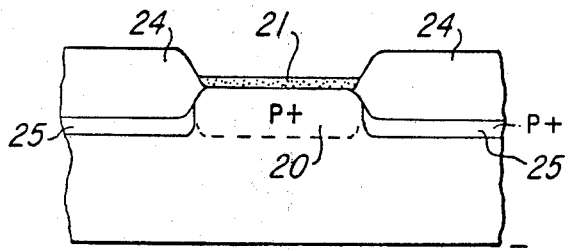
Figure 5C:
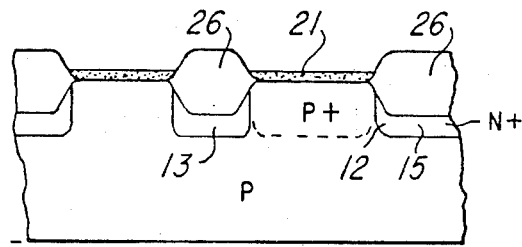

Referring to FIG. 4c, a second field oxidation step is now performed by placing the slice in steam or dry oxygen at about 1000° C. for several hours, oxidizing all of the top of the slice not covered by the remaining parts of the nitride layer 32 and producing field oxide 26 of about 5000 Å thickness (FIG. 5c). During this oxidation, the areas of field oxide 24 (FIG. 4c) grow thicker, to perhaps 10,000 Å. The N+ regions 34 are partly consumed but also diffuse further into the silicon ahead of the oxidation front to create the heavily doped regions 12, 13, 15 and 17.

Next the remaining nitride layer 32 is removed by an etchant which attacks nitride but not silicon oxide, then the oxide 31 is removed by a so-called "dip out" etch step. The gate oxide 21 is grown by thermal oxidation to a thickness of about 500 to 800 Å. A boron ion implant step is done at this point to produce the P+ tank regions 20. Also, windows for polysilicon to silicon contacts, if needed, are patterned and etched at this point using photoresist; none are needed in the EPROM array itself but may be used in peripheral transistors.

Figure 4D:
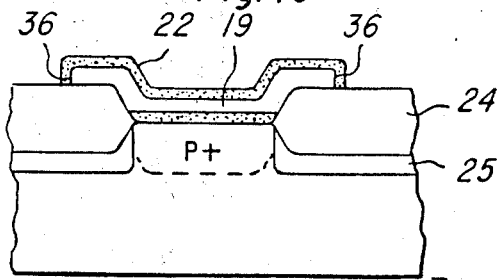
Figure 4E:
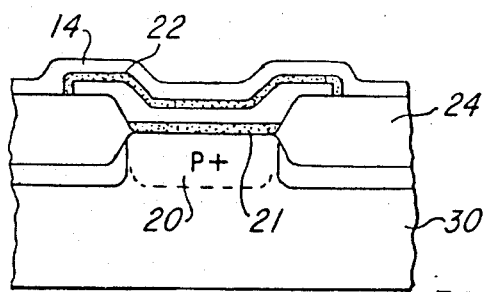

As seen in FIG. 4d a layer of polycrystalline silicon is deposited over the entire slice in a reactor using standard techniques to a thickness of about 5000 Å, then doped with phosphorus by an N+ diffusion or implant to make it highly conductive. This first level polysilicon layer may be partially patterned at this point by applying a layer of photoresist, exposing to ultraviolet light through a mask prepared for this purpose, developing, then etching the photoresist. That is, the edges 36 beneath the address lines 14 (see FIG. 1), over the field oxide, are defined at this time by a photoresist operation. It is advantageous from a cell density standpoint, however, that the edges of the floating gate next to the sources and drains be etched at the same time as the second level poly so the two levels are self-aligned.

Figure 5D:
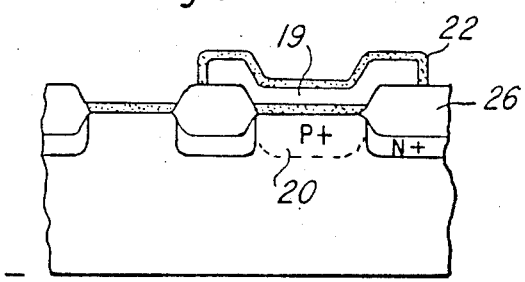
Figure 5E:
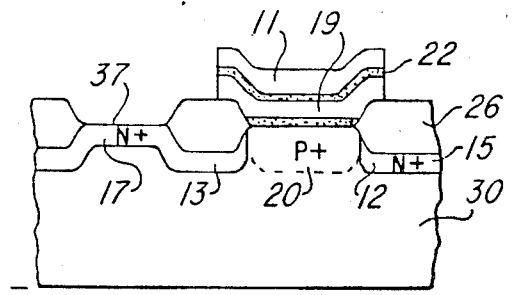

The upper surface of the first level polysilicon 19 is oxidized by exposing the slice to an oxidizing atmosphere at about 1000° C. to create the thermal oxide layer 22 over the floating gates. The thickness of this layer is about 1000 Å. A second level of polycrystalline silicon is next deposited over the slice, N+ diffused to make it highly conductive, then masked by photoresist and etched to leave the address lines 14 (FIG. 4e) and the control gates 11 (FIG. 5e). This etch step also defines the edges of the floating gate 19. When the first level polysilicon is first patterned the floating gates 19 are left as parts of wide elongated strips of poly running perpendicular to what will be the address lines 14. Then, when the second level poly is patterned, parts of the first poly are removed at the same time, so the edges of the floating gates 19 coincide with the edges of the address lines 14. This allows the cell size to be smaller because no excess overlap is needed to assure that the control gates completely cover the floating gates.

Referring to FIG. 3, a thermal layer is grown over the second level poly then the layer 23 deposited at low temperature, about 400° C. This layer 23 insulates the metal level from the second level polycrystalline silicon, and is referred to as multilevel oxide.

The multilevel oxide layer 23 is patterned by a photoresist operation, exposing the contact areas 27 and 37 for metal-to-silicon contacts over the regions 15 and 17 in the cell array.

It will be noted that connection is made by leaving a segment of the nitride layer 32 over the contact areas 27 and 37 when the oxide 26 is grown, then making an N+ diffusion into these contact areas at a later time, such as when the poly is phosphorus-diffused.

The metal contacts and interconnections are made by depositing a thin film of aluminum over the entire top surface of the slice then patterning it by a photoresist mask and etch sequence. This leaves the metal strips 16 and 18.

In the cell shown above, the patterned first level of poly floating gate 19 extends out over the source and drain regions 12 and 13 without significant coupling to them because of the thickness of the oxide 26. The self-aligned patterning of the edges 36 allows complete overlap of the two polysilicon layers without the need for excess silicon area for alignment tolerance. The increase in coupling capacitance compared to conventional EPROMs is especially significant for short channel cells where the second level poly overlap of the source and drain may comprise a substantial portion of the cell. For comparable process rules and layouts for a given 128K bit EPROM array having about 0.14×0.14 channel dimensions, coupling area to second poly can be increased by as much as 50% using the concepts of the invention, resulting in a 10% increase in coupling ratio. The new cell thus has several advantages. First, there is great leverage in increasing the second poly to first poly overlap area, giving a much more favorable coupling ratio and consequently higher channel currents at a fixed gate and drain bias. Second, the self-aligned stacked gate eliminates the design overhead associated with the tolerances required for second poly to first poly alignment. Third, it eliminates the second poly to source-drain overlap capacitance, a major source of parasitic capacitance on control gates, lines 14, and address lines 18, speeding up the EPROM circuit. Fourth, the new cell process does not lead to an increase in second poly series resistance for short channel devices as would be the case if the self-aligned stacked gate concept was used with the conventional process. Fifth, this process offers the benefit of using the self-aligned concept with thick oxide over source and drain in the peripheral circuits, giving the ability to cross over moat with first level poly, which is advantageous especially in decoders. Sixth, the implant of P+ tank 20 just prior to first poly deposition is self-aligned with the channel and thus eliminates additional capacitance to source and drain caused by the P+ to N+ overlap in present processes.

While this invention has been described with reference to illustrative embodiments, this description is not intended to be construed in a limiting sense. Various modifications of the illustrative embodiments, as well as other embodiments of the invention, will be apparent to persons skilled in the art upon reference to this description. It is, therefore contemplated that the appended claims will cover any such modifications or embodiments as fall within the true scope of the invention.

What is claimed is:

1. A semiconductor device comprising:
    a first field oxide on a face of a semiconductor body surrounding an active area of the face,
    a plurality of heavily doped regions in said face in said active area, such regions being covered by a second field oxide at said face, such regions being spaced from one another,
    a first layer of conductive material overlying said face at said active area forming an electrode located above the space between the heavily doped regions and also overlapping the heavily doped regions by a significant amount, the first layer also extending over the first field oxide by a substantial amount,
    a second layer of conductive material on said face overlying the first layer and defining an elongated strip overlying the heavily doped regions, the second layer having opposite edges coinciding with edges of the first layer,
    a thin insulator separating the first layer from said face, the first and second field oxides being much thicker than said thin insulator.

2. A semiconductor device according to claim 1 wherein said electrode is a floating gate of a programmable field effect transistor, and said elongated strips forms an address lines and control gate for the transistor.

3. A semiconductor device according to claim 2 wherein the thin insulator is thin gate oxide separating the floating gate from said face, and said first and second field oxide is much thicker than the gate oxide.

* * * * *